(12) United States Patent
Endo et al.

(10) Patent No.: US 6,429,143 B1
(45) Date of Patent: Aug. 6, 2002

(54) PATTERN FORMATION METHOD

(75) Inventors: Masayuki Endo; Masaru Sasago, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/924,092

(22) Filed: Aug. 8, 2001

(30) Foreign Application Priority Data

Dec. 19, 2000 (JP) ........................................ 2000-385463

(51) Int. Cl.$^7$ ............................................ H01L 21/302
(52) U.S. Cl. ...................... 438/725; 438/622; 438/625
(58) Field of Search ................................ 438/725, 622, 438/694, 695, 745; 437/195

(56) References Cited

U.S. PATENT DOCUMENTS 5,595,938 A * 1/1997 Miyazaki .................... 437/195
5,660,681 A * 8/1997 Fukuda et al. ............... 438/695
5,744,281 A * 4/1998 Niki et al. ................ 430/270.1
5,750,316 A * 5/1998 Kawamura et al. ......... 430/311
6,255,225 B1 * 7/2001 Yamada et al. .............. 438/725

FOREIGN PATENT DOCUMENTS

| JP | 08-153704 | 6/1996 |
| JP | 2000-77386 | 3/2000 |
| JP | 2000-208497 | 7/2000 |

* cited by examiner

*Primary Examiner*—John F. Niebling
*Assistant Examiner*—Olivia Luk
(74) *Attorney, Agent, or Firm*—Nixon Peabody LLP; Donald R. Studebaker

(57) ABSTRACT

An anti-reflection film of an organic compound is formed on a substrate. The anti-reflection film is weakened by carrying out plasma processing on the anti-reflection film, and then, a resist film is formed on the weakened anti-reflection film. The resist film is subjected to pattern exposure and development so as to form a resist pattern from the resist film. The anti-reflection film is dry etched by using the resist pattern as a mask, so as to pattern the anti-reflection film.

1 Claim, 4 Drawing Sheets

PATTERN FORMATION METHOD

BACKGROUND OF THE INVENTION

The present invention relates to a pattern formation method for patterning an anti-reflection film of an organic compound by etching the anti-reflection film with a resist pattern used as a mask.

In accordance with recent development in refinement of semiconductor devices, it has become significant in the fabrication process for semiconductor devices and the like to reduce exposing light reflecting from a substrate for improving accuracy of a resist pattern. Therefore, an anti-reflection film is formed between an etch target film and a resist pattern.

An anti-reflection film may be formed from an organic compound or an inorganic compound, but an anti-reflection film of an organic compound is frequently used because it can be formed by spin coating by using the same apparatus as that used for forming a resist film.

A conventional pattern formation method described in, for example, Japanese Laid-Open Patent Publication Nos. 8-153704 and 2000-77386 will now be described with reference to FIGS. 3A through 3C and 4A through 4C.

First, an anti-reflection film 2 of an organic compound is formed on a semiconductor substrate 1 as shown in FIG. 3A, and a resist film 3 with a thickness of 0.4 $\mu$m is formed on the anti-reflection film 2 as shown in FIG. 3B.

Next, the resist film 3 is irradiated with ArF excimer laser 5 through a photomask 4 for pattern exposure as shown in FIG. 3C, and the resultant semiconductor substrate 1 is subjected to post-exposure bake (PEB) carried out at, for example, 105 for 90 seconds as shown in FIG. 4A.

Then, the resist film 3 is developed with an alkaline developer after the PEB, thereby forming a line and space resist pattern 3A of 0.15 $\mu$m as shown in FIG. 4B.

Subsequently, the anti-reflection film 2 is dry etched by using the resist pattern 3A as a mask, thereby forming an anti-reflection film pattern 2A from the anti-reflection film 2 as shown in FIG. 4C.

Since exposing light recently has a shorter wavelength, there arises necessity for increasing the anti-reflection function of the anti-reflection film 2, and therefore, it is recently necessary to form the anti-reflection film 2 in a large thickness of approximately 0.1 $\mu$m.

Accordingly, during the procedure for forming the anti-reflection film. pattern 2A through the dry etching of the anti-reflection film 2 with the resist pattern 3A used as the mask, the resist pattern 3A is largely damaged. Therefore, after patterning the anti-reflection film 2 by the dry etching, the shape of the resist pattern 3A is frequently degraded as shown in FIG. 4C.

When the etch target film formed on the semiconductor substrate 1 is etched by using the resist pattern 3A in such a degraded shape as a mask, the shape of the pattern formed from the etch target film is also disadvantageously degraded.

SUMMARY OF THE INVENTION

In consideration of the aforementioned conventional problem, an object of the invention is suppressing degradation in the shape of a resist pattern caused in conducting dry etching on an anti-reflection film of an organic compound with a large thickness by using the resist pattern as a mask.

The pattern formation method of this invention comprises the steps of forming an anti-reflection film of an organic compound on a substrate; weakening the anti-reflection film by subjecting the anti-reflection film to plasma processing; forming a resist film on the weakened anti-reflection film; forming a resist pattern from the resist film by subjecting the resist film to pattern exposure and development; and patterning the anti-reflection film by dry etching the anti-reflection film with the resist pattern used as a mask.

In the pattern formation method of this invention, the anti-reflection film is weakened through the plasma processing before forming the resist film, and then, the anti-reflection film is dry etched by using the resist pattern as a mask. Therefore, the anti-reflection film has been weakened before being patterned. Accordingly, the anti-reflection film can be easily dry etched, which suppresses degradation of the shape of the resist pattern. As a result, the etch target film can be etched by using the resist pattern in a good shape as a mask, and hence, a pattern having a good shape can be formed from the etch target film.

In the pattern formation method, the plasma processing is preferably carried out by using plasma seed including oxygen or fluorine.

Thus, the anti-reflection film can be definitely weakened.

DETAILED DESCRIPTION OF THE INVENTION

Figure 1A:
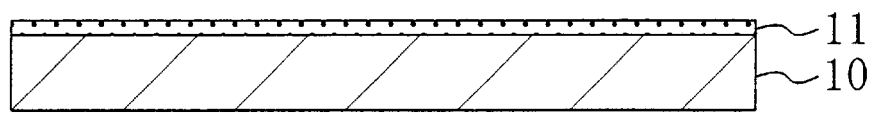
FIGS. 1A, 1B, 1C and 1D are cross-sectional views for showing procedures in a pattern formation method according to an embodiment of the invention.

A pattern formation method according to a preferred embodiment of the invention will now be described with reference to FIGS. 1A through 1D and 2A through 2C. First, as shown in FIG. 1A, an anti-reflection film 11 (such as AR19 manufactured by Shipley Far East Co., Ltd.) of an organic compound having a thickness of, for example, 100 nm (0.1 $\mu$m) is formed on a semiconductor substrate 10.

Figure 1B:
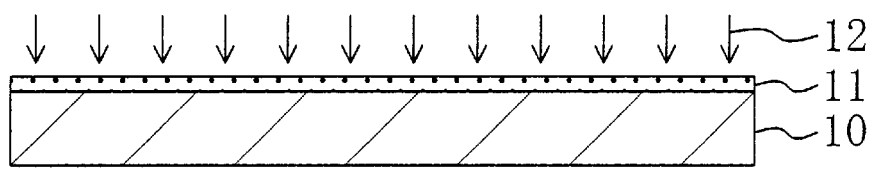

Next, as shown in FIG. 1B, the anti-reflection film 11 is irradiated with plasma 12 of a gas including oxygen or fluorine. Thus, the anti-reflection film 11 is weakened because its density is lowered.

The plasma processing may be carried out under any of the following two conditions:

In the first condition, the anti-reflection film 11 is irradiated with the plasma 12 including plasma seed of oxygen for approximately 5 seconds in a vacuum chamber kept at a degree of vacuum of 1.33 Pa with an oxygen gas introduced into the vacuum chamber at a volume flow rate per minute f 15 ml in a normal condition under application of high frequency power of 10 W. Thus, the anti-reflection film 11 is reduced in its thickness by approximately 8.5 nm and can be definitely weakened.

In the second condition, the anti-reflection film 11 is irradiated with the plasma 12 including plasma seed of fluorine for approximately 15 seconds in a vacuum chamber kept at a degree of vacuum of 1.33 Pa with a $CHF_3$ gas introduced into the vacuum chamber at a volume flow rate per minute of 20 ml in a normal condition under application of high frequency power of 50 W. Thus, the anti-reflection film 11 is reduced in its thickness by approximately 6.5 nm and can be definitely weakened.

Figure 1C:
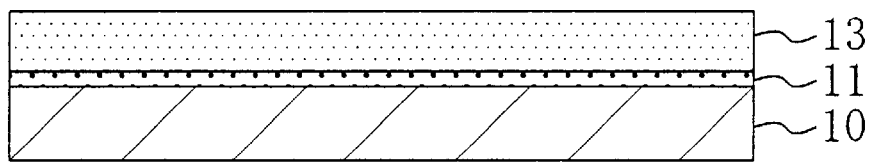

Next, as shown in FIG. 1C, a resist film 13 (such as PAR-101 manufactured by Sumitomo Chemical Co., Ltd.) with a thickness of 0.4 μm is formed on the anti-reflection film 11 having been weakened by the plasma processing.

Figure 1D:
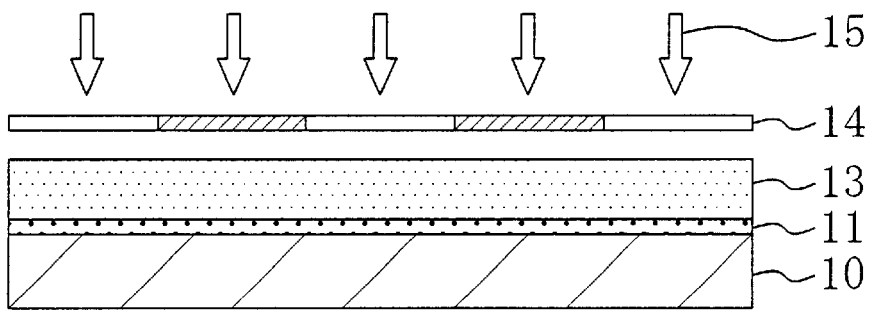
Figure 2A:
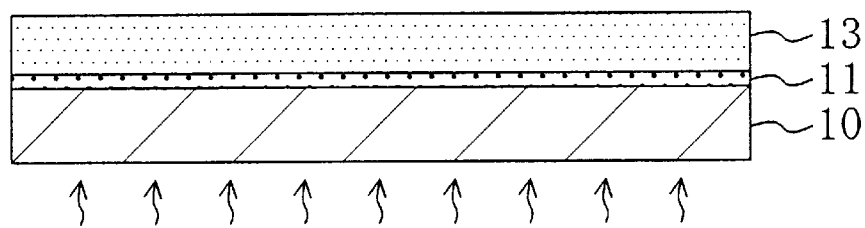
FIGS. 2A, 2B and 2C are cross-sectional views for showing other procedures in the pattern formation method according to the embodiment of the invention.

Then, a s shown in FIG. 1D, the resist film 13 is irradiated with ArF excimer laser 15 at numerical aperture (NA) of 0.60 through a photomask 14 for pattern exposure. Thereafter, as shown in FIG. 2A, the resultant semiconductor substrate 10 is subjected to post-exposure bake (PEB) carried out at, for example, 105 for 90 seconds.

Figure 2B:
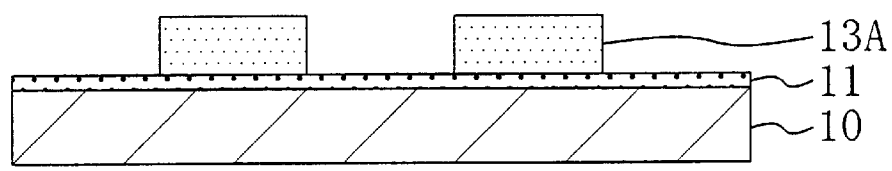

Subsequently, as shown in FIG. 2B, the resist film 13 is developed with an alkaline developer after the PEB, thereby forming a line and space resist pattern 13A of 0.15 μm.

Figure 2C:
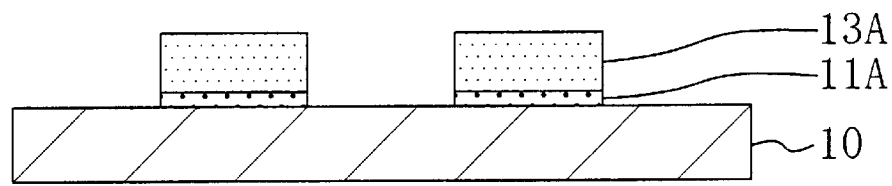
Figure 3A:
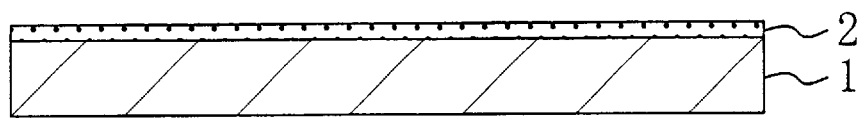
FIGS. 3A, 3B and 3C are cross-sectional views for showing procedures in a conventional pattern formation method.
Figure 3B:
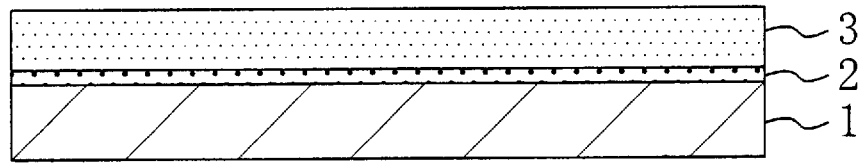
Figure 3C:
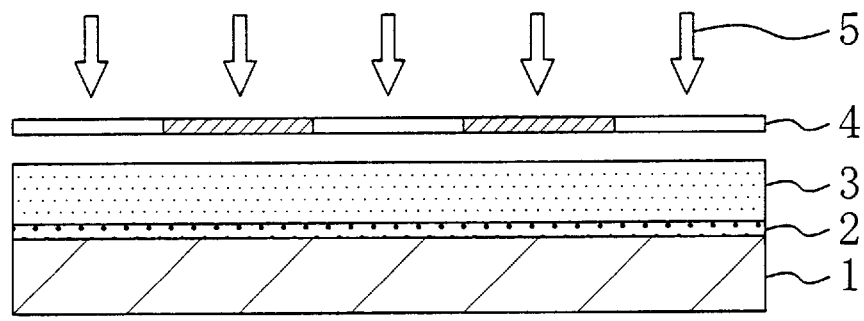
Figure 4A:
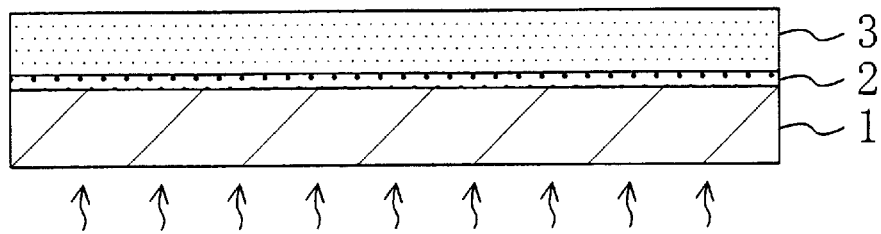
FIGS. 4A, 4B and 4C are cross-sectional views for showing other procedures in the conventional pattern formation method.
Figure 4B:
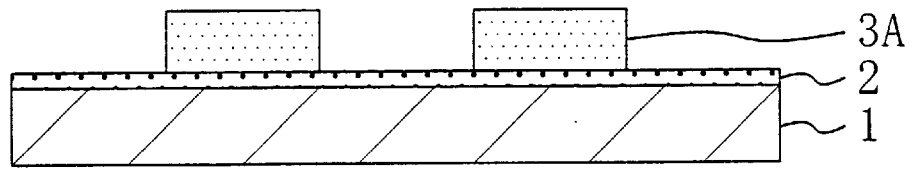
Figure 4C:
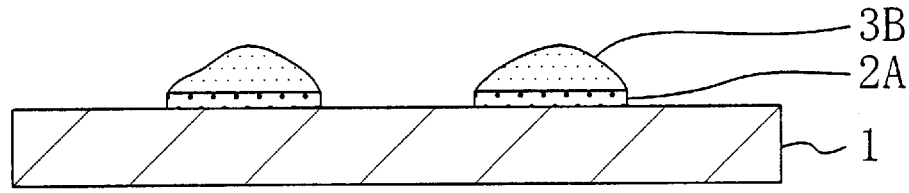

Next, as shown in FIG. 2C, the weakened anti-reflection film 11 is dry etched by using the resist pattern 13A as a mask, thereby forming an anti-reflection film pattern 11A from the anti-reflection film 11.

Since the anti-reflection film 11 having been weakened by the plasma processing is thus dry etched by using the resist pattern 13A as a mask, the anti-reflection film 11 can be easily dry etched into the pattern although it is made from an organic compound similarly to the resist pattern 13A and has a large thickness. Therefore, the etch target film formed on the semiconductor substrate 10 can be etched by using the resist pattern 13A in a good shape as a mask, resulting in forming the pattern in a good pattern shape from the etch target film.

What is claimed is:

1. A pattern formation method comprising the steps of:

forming an anti-reflection film of an organic compound on a substrate;

weakening said anti-reflection film by subjecting said anti-reflection film to plasma processing;

forming a resist film on said weakened anti-reflection film;

forming a resist pattern from said resist film by subjecting said resist film to pattern exposure and development;

patterning said anti-reflection film by dry etching said anti-reflection film with said resist pattern used as a mask; and wherein said plasma processing is carried out by using plasma seed mainly including fluorine.

* * * * *